(12) United States Patent
Chew

(10) Patent No.: US 11,232,957 B2
(45) Date of Patent: Jan. 25, 2022

(54) CHIP PACKAGING METHOD AND PACKAGE STRUCTURE

(71) Applicant: PEP INNOVATION PTE. LTD., Singapore (SG)

(72) Inventor: Jimmy Chew, Singapore (SG)

(73) Assignee: PEP INOVATION PTE. LTD., Singapore (SG)

( * ) Notice: Subject to any disclaimer, the term of this patent is extended or adjusted under 35 U.S.C. 154(b) by 0 days.

(21) Appl. No.: 16/805,850

(22) Filed: Mar. 2, 2020

(65) Prior Publication Data

US 2020/0203188 A1    Jun. 25, 2020

Related U.S. Application Data

(63) Continuation-in-part of application No. 15/826,268, filed on Nov. 29, 2017, now Pat. No. 11,049,734.

(30) Foreign Application Priority Data

Mar. 4, 2019  (SG) ............................ 10201901893Q
Mar. 11, 2019 (SG) ............................ 10201902149Q
(Continued)

(51) Int. Cl.
*H01L 23/29* (2006.01)
*H01L 23/31* (2006.01)
(Continued)

(52) U.S. Cl.
CPC .......... *H01L 21/568* (2013.01); *H01L 21/561* (2013.01); *H01L 23/295* (2013.01);
(Continued)

(58) Field of Classification Search
CPC ......... H01L 24/24; H01L 24/32; H01L 24/73; H01L 24/82; H01L 23/295;
(Continued)

(56) References Cited

U.S. PATENT DOCUMENTS 6,396,159 B1   5/2002  Shoji
8,293,576 B2  10/2012  Chino
(Continued)

FOREIGN PATENT DOCUMENTS

CN    103383927    11/2013
CN    103515252     1/2014
(Continued)

*Primary Examiner* — Thanhha S Pham
(74) *Attorney, Agent, or Firm* — Javalon Law, PC

(57) ABSTRACT

The present disclosure provides a chip packaging method and a chip package structure. The chip packaging method comprises: forming wafer conductive traces on a wafer active surface of a wafer; forming a protective layer having material properties on the wafer conductive traces; cutting the wafer to obtain a die and adhering the die onto a carrier; forming a molding layer encapsulating the die and having material properties; stripping off the carrier; and forming a panel-level conductive layer and a dielectric layer. The chip packaging method reduces or eliminates warpage in the panel packaging process, lowers a requirement on an accuracy of aligning the die on the panel, reduces a difficulty in the panel packaging process, and makes the packaged chip structure more durable, and thus the present disclosure is especially suitable for large panel-level package and package of a thin chip with a large electric flux.

20 Claims, 10 Drawing Sheets

(30) Foreign Application Priority Data

Mar. 19, 2019 (SG) .......................... 10201902426V
Jul. 19, 2019 (CN) .......................... 201910656851.4

(51) Int. Cl.
*H01L 23/00* (2006.01)
*H01L 21/56* (2006.01)

(52) U.S. Cl.
CPC .......... *H01L 23/3135* (2013.01); *H01L 24/05* (2013.01); *H01L 24/13* (2013.01); *H01L 24/24* (2013.01); *H01L 2224/02311* (2013.01); *H01L 2224/02331* (2013.01); *H01L 2224/02379* (2013.01); *H01L 2224/02381* (2013.01); *H01L 2224/13024* (2013.01); *H01L 2224/24101* (2013.01); *H01L 2224/24137* (2013.01)

(58) Field of Classification Search
CPC ............. H01L 23/3107; H01L 23/3114; H01L 23/3135; H01L 23/3171; H01L 23/3185; H01L 24/96; H01L 2023/4037; H01L 2023/405; H01L 23/49568
See application file for complete search history.

(56) References Cited

U.S. PATENT DOCUMENTS

| | | | |
|---|---|---|---|
| 8,848,380 B2 | 9/2014 | Malatkar et al. | |
| 10,431,477 B2 | 10/2019 | Chew | |
| 2009/0152715 A1 | 6/2009 | Shim et al. | |
| 2009/0261466 A1 | 10/2009 | Pagaila et al. | |
| 2010/0140779 A1 | 6/2010 | Lin et al. | |
| 2011/0026232 A1 | 2/2011 | Lin et al. | |
| 2011/0241222 A1 | 10/2011 | Sezi et al. | |
| 2011/0278741 A1 | 11/2011 | Chua et al. | |
| 2012/0119373 A1 | 5/2012 | Hunt | |
| 2012/0313238 A1* | 12/2012 | Sato ............... | H01L 21/568 257/737 |
| 2013/0241048 A1 | 9/2013 | Lin et al. | |
| 2013/0295725 A1 | 11/2013 | Park et al. | |
| 2013/0341784 A1 | 12/2013 | Lin et al. | |
| 2014/0023885 A1 | 1/2014 | Choi et al. | |
| 2014/0027885 A1 | 1/2014 | Kawase et al. | |
| 2014/0027929 A1 | 1/2014 | Lin et al. | |
| 2014/0042638 A1 | 2/2014 | Liu et al. | |
| 2015/0137162 A1 | 5/2015 | Sabathil et al. | |
| 2015/0145142 A1 | 5/2015 | Lin et al. | |
| 2015/0162289 A1 | 6/2015 | Chang et al. | |
| 2015/0179616 A1 | 6/2015 | Lin et al. | |
| 2015/0206855 A1* | 7/2015 | Lin .................... | H01L 25/0655 257/738 |
| 2015/0243607 A1 | 8/2015 | Jang et al. | |
| 2015/0314941 A1 | 11/2015 | Ramadas et al. | |
| 2016/0155713 A1 | 6/2016 | Kim et al. | |
| 2016/0276307 A1 | 9/2016 | Lin | |
| 2016/0338202 A1 | 11/2016 | Park et al. | |
| 2016/0343697 A1 | 11/2016 | Lee et al. | |
| 2017/0084589 A1* | 3/2017 | Kuo .................... | H01L 23/3128 |
| 2017/0133334 A1 | 5/2017 | Kim et al. | |
| 2017/0250171 A1 | 8/2017 | Yu et al. | |
| 2017/0309571 A1 | 10/2017 | Yi et al. | |
| 2017/0365566 A1 | 12/2017 | Lee et al. | |
| 2018/0082917 A1 | 3/2018 | Cheng et al. | |
| 2018/0166396 A1 | 6/2018 | Lee et al. | |
| 2018/0190513 A1 | 7/2018 | Chew | |
| 2018/0204741 A1 | 7/2018 | Chew | |
| 2018/0268188 A1 | 9/2018 | Zhang et al. | |
| 2018/0269188 A1 | 9/2018 | Yu et al. | |

FOREIGN PATENT DOCUMENTS

| | | |
|---|---|---|
| CN | 105304586 | 2/2016 |
| TW | 201327744 | 7/2013 |
| TW | 201830621 A | 8/2018 |
| TW | 201832297 A | 9/2018 |
| TW | 201834085 A | 9/2018 |
| TW | 201834086 | 9/2018 |
| TW | 201834088 | 9/2018 |
| TW | 201900761 | 1/2019 |
| TW | M589895 U | 1/2020 |
| TW | M589897 | 1/2020 |

* cited by examiner

CHIP PACKAGING METHOD AND PACKAGE STRUCTURE

CROSS-REFERENCE TO RELATED APPLICATIONS

This application is a continuation-in-part application of co-pending U.S. patent application Ser. No. 15/826,268 entitled "Method of Packaging Chip and Chip Package Structure", filed on Nov. 29, 2017, and cross-references to co-pending U.S. patent application Ser. No. 16/805,846 entitled "Chip Packaging Method and Package Structure", filed on Mar. 2, 2020, co-pending U.S. patent application Ser. No. 16/805,851 entitled "Chip Packaging Method and Package Structure", filed on Mar. 2, 2020 and co-pending U.S. patent application Ser. No. 16/805,853 entitled "Chip Packaging Method and Chip Structure", filed on Mar. 2, 2020. All disclosures are herein incorporated by reference in their entireties for all purposes.

TECHNICAL FIELD

The present disclosure relates to a field of semiconductor technologies, and more particularly, to a chip packaging method and a package structure.

BACKGROUND

Panel-level package is a process of cutting a wafer to separate out a plurality of dies, arranging and adhering the dies onto a carrier, and simultaneously packaging the plurality of dies in a same process. The panel-level package has received wide attention as a technique emerging in recent years; and as compared with traditional wafer-level package, the panel-level package has advantages of high production efficiency, low production costs, and better applicability to mass production.

However, numerous technical barriers exist in the panel-level package, for example, a warpage problem of the panel, an accuracy of alignment of the die on the panel, and so on.

Especially under a current trend that electronic devices become smaller and lighter, small and thin chips are increasingly favored by the market; however, difficulties in packaging the small and thin chips by using a large panel packaging technique should not be underestimated.

SUMMARY

According to various embodiments, there is provided a chip package structure, comprising: at least one die, the at least one die including a die active surface and a die back surface; a conductive structure, provided on the die active surface; a protective layer, provided on the die active surface; a molding layer, the molding layer encapsulating the at least one die; and a dielectric layer.

According to various embodiments, there is provided a chip packaging method, comprising: providing a wafer, the wafer having a wafer active surface and a wafer back surface; forming wafer conductive traces on the wafer active surface of the wafer; forming a protective layer on the wafer conductive traces; cutting the wafer to obtain a die and adhering the die onto a carrier; forming a molding layer encapsulating the die; stripping off the carrier; and forming a panel-level conductive layer and a dielectric layer.

BRIEF DESCRIPTION OF THE DRAWINGS

FIG. 1 to FIG. 14 are schematic diagrams of a chip packaging method according to an exemplary embodiment of the present disclosure, in which:

FIG. 1 is a schematic diagram of a wafer according to the exemplary embodiment of the present disclosure;

FIG. 3 is a schematic diagram of the wafer applied with a protective layer according to the exemplary embodiment of the present disclosure;

FIG. 5 is a schematic diagram of the wafer formed with conductive filled vias according to the exemplary embodiment of the present disclosure;

FIG. 6 is a schematic diagram of cutting the wafer to form a die according to the exemplary embodiment of the present disclosure;

FIG. 8 is a schematic diagram of forming a molding layer on the carrier according to the exemplary embodiment of the present disclosure;

FIG. 10 is a schematic diagram of stripping off the carrier and an adhesive layer according to the exemplary embodiment of the present disclosure;

FIG. 11 is a schematic diagram of forming the conductive filled vias and conductive traces on a panel assembly according to the exemplary embodiment of the present disclosure;

FIG. 12 is a schematic diagram of forming conductive studs on the panel assembly according to the exemplary embodiment of the present disclosure;

FIG. 14 is a schematic diagram of cutting the panel assembly to obtain a packaged chip according to the exemplary embodiment of the present disclosure;

DETAILED DESCRIPTION

In order to make the technical solution of the present disclosure clearer and the technical effect more apparent, preferred embodiments of the present disclosure will be described and explained in detail below in conjunction with the accompanying drawings; it cannot be understood that the description below is the only implementation form of the present disclosure or a limitation to the present disclosure.

FIG. 1 to FIG. 14 are schematic diagrams of a chip packaging method according to an exemplary embodiment of the present disclosure.

Figure 1:
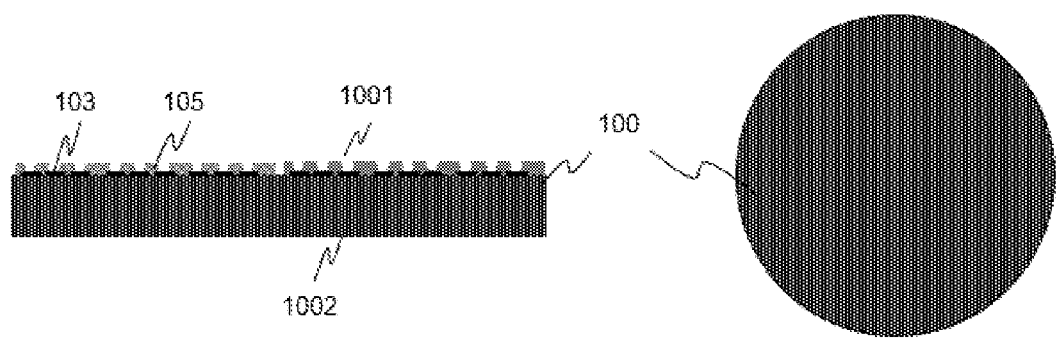

As shown in FIG. 1, at least one wafer 100 is provided; the wafer 100 has a wafer active surface 1001 and a wafer back surface 1002; the wafer 100 includes a plurality of dies 113, and active surfaces of the dies constitutes the wafer active surface 1001; the active surface of each die in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form a functional circuit, so as to implement various functions. The wafer active surface 1001 further includes an electrical connection pad 103 for leading out the functional circuit and an insulating layer 105 for protecting the electrical connection pad 103.

Figure 2A:
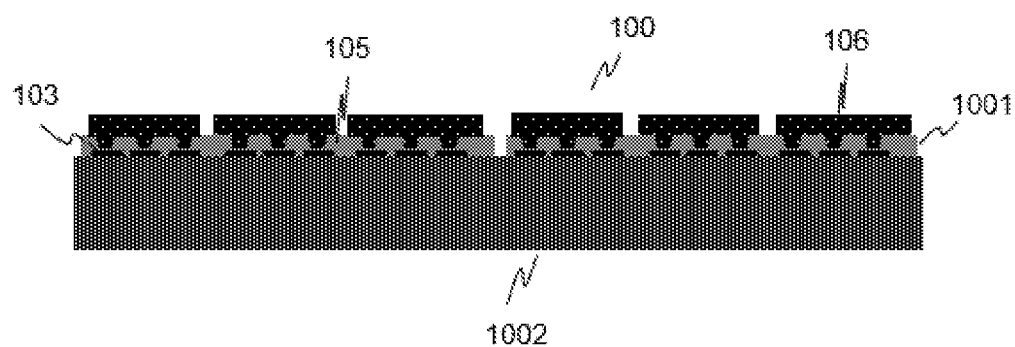
FIG. 2a and FIG. 2b are schematic diagrams of the wafer formed with wafer conductive traces according to the exemplary embodiment of the present disclosure.
Figure 2B:
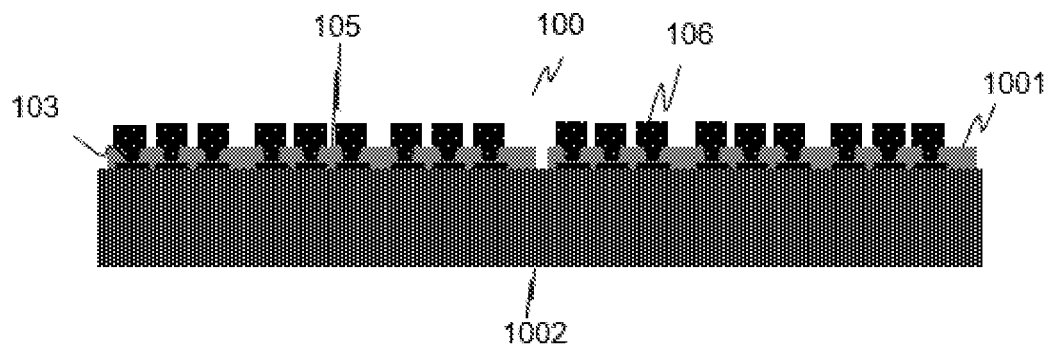

As shown in FIG. 2a and FIG. 2b, a wafer conductive trace 106 is formed on the wafer active surface 1001.

The wafer conductive trace 106 for example is made of a material such as copper, gold, silver, tin, aluminum and the like, or a combination thereof, or other suitable conductive materials by physical vapor deposition (PVD), chemical vapor deposition (CVD), sputtering, electrolytic electroplating, electrodeless electroplating, or other suitable metal deposition processes.

At least one of the wafer conductive traces 106 are connected with at least a part of the electrical connection pads 103 provided on the wafer active surface 1001.

Optionally, as shown in FIG. 2a, the wafer conductive trace 106 interconnects and leads out a plurality of electrical connection pads 103 of at least a part of the electrical connection pads 103 provided on the wafer active surface 1001.

Formation of the wafer conductive trace 106 reduces the amount of protective layer openings 109 formed in a subsequent process; and the wafer conductive trace 106 is employed to firstly interconnect the plurality of electrical connection pads 103 according to the circuit design, so that it is not necessary to form the protective layer opening 109 on each electrical connection pad 103.

Optionally, as shown in FIG. 2b, the wafer conductive traces 106 respectively leads out at least a part of the electrical connection pads 103 provided on the wafer active surface 1001.

Formation of the wafer conductive trace 106 reduces a difficulty of forming the protective layer opening 109 in a subsequent process; due to the presence of the wafer conductive trace 106, a lower surface 109a of the protective layer opening has a larger area, and accordingly the protective layer opening 109 has a larger area, so that it is possible to form the protective layer opening especially on the wafer 100 having a smaller exposed electrical connection pad 103.

Although not shown in the drawings, it should be understood that, a part of the wafer conductive traces 106 respectively lead out a part of the electrical connection pads 103 provided on the wafer active surface 1001, and each of a part of the wafer conductive traces 106 interconnects and leads out a part of the electrical connection pads 103 provided on the wafer active surface 1001.

Figure 3:
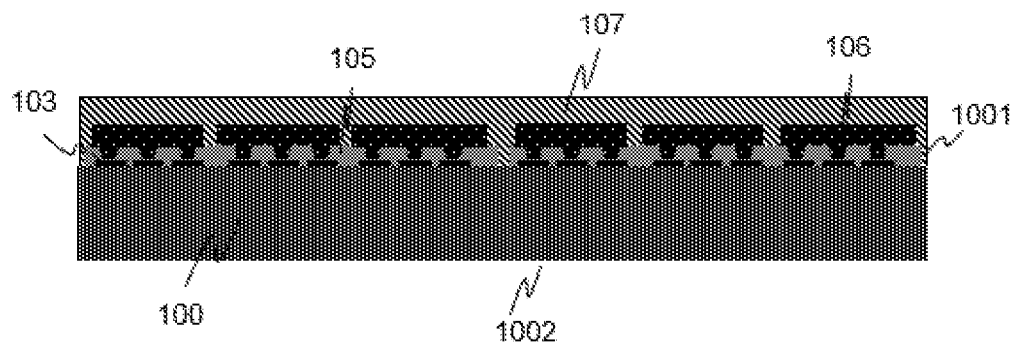

As shown in FIG. 3, a protective layer 107 is applied to the wafer active surface 1001 and the wafer conductive trace 106.

The protective layer 107 is made of an insulating material, optionally, for example, benzocyclobutene (BCB), polyimide (PI), polybenzoxazole (PBO), polymer-based dielectric film, organic polymer film, or is made of other material having similar insulation and structural properties, by lamination, coating and printing, etc.

In one embodiment, the protective layer is applied by lamination.

Optionally, before the step of applying the protective layer 107, the wafer active surface 1001 and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

The protective layer 107 protects the die active surface 1131. In a subsequent molding process, a package pressure is liable to cause a flowing molding material to permeate into a gap between the die 113 and a carrier 117 under a heating condition (particularly in the case that the die active surface 1131 is formed with the wafer conductive trace 106), so that the gap between the die and the carrier becomes even larger, and the molding material is more easy to permeate into the gap during the molding process. By providing the protective layer on the die active surface 1131, the protective layer 107 protects the die active surface 1131 by preventing permeation of the molding material, so as to protect the die active surface 1131 from being damaged.

A bonding effect between the die 113 and an adhesive layer 121 is strengthened due to the presence of the protective layer 107, so that during the molding process, the package pressure is not easy to cause position shift of the die 113 on a carrier 117.

In a preferred embodiment, the protective layer 107 has a Young's modulus in a range of 1,000 MPa to 20,000 MPa; more preferably, the protective layer 107 has a Young's modulus in a range of 1,000 MPa to 10,000 MPa; further preferably, the protective layer 107 has a Young's modulus in a range of 1,000 MPa to 7,000 MPa, 4,000 MPa to 7,000 MPa, or 4,000 MPa to 8,000 MPa; and in a most preferred embodiment, the protective layer 107 has a Young's modulus of 5,500 MPa.

In a preferred embodiment, the protective layer 107 has a thickness in a range of 15 μm to 50 μm; more preferably, the protective layer 107 has a thickness in a range of 20 μm to 50 μm; in a preferred embodiment, the protective layer 107 has a thickness of 35 μm; in another preferred embodiment, the protective layer 107 has a thickness of 45 μm; and in still another preferred embodiment, the protective layer 107 has a thickness of 50 μm.

The protective layer 107 has the Young's modulus in the range of 1,000 MPa to 20,000 MPa; on one hand, the protective layer 107 is soft and has good flexibility and elasticity; on the other hand, the protective layer provides sufficient supporting force so that the protective layer 107 provides sufficient support for a conductive layer formed on the surface of the protective layer 107. Meanwhile, the protective layer 107 has the thickness in the range of 15 μm to 50 μm, it is ensured that the protective layer 107 provides sufficient buffering and support.

Particularly, in some types of chips, it is required not only that a thin die is packaged, but also that the conductive layer has a certain thickness suitable for a large electric flux; at this time, it is selected that the protective layer 107 has the thickness in the range of 15 μm to 50 μm and has the Young's modulus in the range of 1,000 MPa to 10,000 MPa. The soft and flexible protective layer 107 forms a buffer layer between the die 113 and the conductive layer formed on the surface of the protective layer, so that the conductive layer on the surface of the protective layer does not excessively press the die 113 and the die 113 is prevented from being broken under pressure of the thick and heavy conductive layer during the chip is used. Meanwhile, the protective layer 107 has a sufficient strength, so that the protective layer 107 provides sufficient support for the thick and heavy conductive layer.

In the case that the protective layer 107 has the Young's modulus in the range of 1,000 MPa to 20,000 MPa, especially in the case that the protective layer 107 has the Young's modulus in the range of 4,000 MPa to 8,000 MPa and has the thickness in the range of 20 μm to 50 μm, due to material properties of the protective layer 107, the protective layer 107 effectively protects the die against a pressure from a pin of a die bonder machine during a subsequent process of transferring the die.

The die transferring process is a reconstruction process of arranging and adhering the die 113 which has underwent the cutting and separating process onto the carrier 117; the die transferring process adopts the die bonder machine; the die bonder machine includes the pin; the die 113 on the wafer 100 is jacked up by the pin, and the die 113 which is jacked up is sucked by a bonder head, and then is transferred and bonded to the carrier 117.

During the process that the pin jacks up the die 113, the die 113, especially the thin die 113, is brittle and is easily broken under the jacking pressure of the pin, so the protective layer 107 having the above material properties protects the brittle die 113 to maintain integrity of the die 113 even under a relatively large jacking pressure.

In a preferred embodiment, the protective layer 107 is an organic/inorganic composite material layer including filler particles. For example, the filler particles are inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In a preferred embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

An organic material has advantages of easy operation and easy application, and the die 113 to be packaged is made of an inorganic material such as silicon; if the protective layer 107 is only made of the organic material, a difference between material properties of the organic material and material properties of the inorganic material may increase a difficulty in the packaging process and affect a packaging effect. By employing the organic/inorganic composite material in which the inorganic particles are added to the organic material, the material properties of the organic material is modified, so that the material of the protective layer 107 has properties of both the organic material and the inorganic material.

In a preferred embodiment, in the case that T<Tg, the protective layer 107 has a coefficient of thermal expansion in a range of 3 ppm/K to 10 ppm/K; in a preferred embodiment, the protective layer 107 has a coefficient of thermal expansion of 5 ppm/K; in a preferred embodiment, the protective layer 107 has a coefficient of thermal expansion of 7 ppm/K; and in a preferred embodiment, the protective layer 107 has a coefficient of thermal expansion of 10 ppm/K.

In a subsequent molding process, the die 113 applied with the protective layer 107 expands and contracts correspondingly during heating and cooling processes of the molding process; in the case that the protective layer 107 has the coefficient of thermal expansion in the range of 3 ppm/K to 10 ppm/K, the protective layer 107 and the die 113 maintain a relatively uniform degree of expansion and contraction, so that an interface stress is not easily caused at a bonding interface between the protective layer 107 and the die 113, and thus the bonding between the protective layer 107 and the die 113 is not easily destroyed and the packaged chip structure is more stable.

The chip after being packaged often needs to undergo a thermal cycle during being used; in the case that the protective layer 107 has the coefficient of thermal expansion in the range of 3 ppm/K to 10 ppm/K, which is the same as or similar to the coefficient of thermal expansion of the die 113, the protective layer 107 and the die 113 maintain a relatively uniform degree of expansion and contraction in the thermal cycle, so that accumulation of interface fatigue at the interface between the protective layer 107 and the die 113 is avoided, and thus the packaged chip becomes more durable and a service life of the packaged chip is prolonged.

On the other hand, if the coefficient of thermal expansion of the protective layer is further reduced, the composite material of the protective layer 107 has to be filled with too many filler particles and the Young's modulus of the material is increased while the coefficient of thermal expansion is further reduced, so that the flexibility of the protective layer is reduced, resulting in excessively strong rigidity but a poor buffering effect of the protective layer 107. It is most preferable to limit the coefficient of thermal expansion of the protective layer to be 5 ppm/k to 10 ppm/k.

In a preferred embodiment, the filler particles in the protective layer 107 (for example, the inorganic oxide particles, such as $SiO_2$ particles) preferably have a diameter of less than 3 μm; preferably, the filler particles in the protective layer 107 (for example, the inorganic oxide particles, such as $SiO_2$ particles) have a diameter between 1 μm and 2 μm.

Controlling the diameter of the filler particles to be less than 3 μm facilitates the protective layer opening formed in the protective layer 107 by a laser patterning process to have a smoother side wall, so that a conductive material is sufficiently filled into the protective layer opening 109 in a conductive material filling process, to avoid a case that, due to a side wall 109c of the protective layer opening 109 having large-sized unevenness, the protective layer opening 109 cannot be filled by the conductive material at a lower side of the side wall that is shielded by a protrusion, and further avoid a case that a conductive property of the conductive filled via 111 is adversely affected.

Meanwhile, by controlling the diameter of the filler particles to be 1 μm to 2 μm, the filler particles with such small diameter will be exposed during the laser patterning process, so that the side wall 109c of the protective layer opening has a certain roughness; in this case, the side wall having a certain roughness and the conductive material have a larger contact area therebetween and thus contact each other more closely, so as to form the conductive filled via 111 with better conductivity.

The above-described diameter of the filler particles is an average value of the diameters of the filler particles.

In a preferred embodiment, the protective layer 107 has a tensile strength in a range of 20 MPa to 50 MPa; and in a preferred embodiment, the protective layer 107 has a tensile strength of 37 MPa.

Optionally, after the process of applying the protective layer 107 to the wafer active surface 1001, the wafer back surface 1002 is ground to thin the wafer 100 to a desired thickness.

Modern electronic devices are small and lightweight, and thus the chip has a tendency of becoming thinner; in the step, the wafer 100 sometimes needs to be thinned to a very small thickness. However, it is very difficult to process and transfer the thin wafer 100, and a process of grinding and thinning the thin wafer 100 is also difficult, so it is usually difficult to thin the wafer 100 to a desired thickness. In the case that the surface of the wafer 100 has the protective layer 107, the protective layer 107 having the above material properties supports the wafer 100, so that the difficulties in processing, transferring and thinning the wafer 100 are reduced.

Figure 4A:
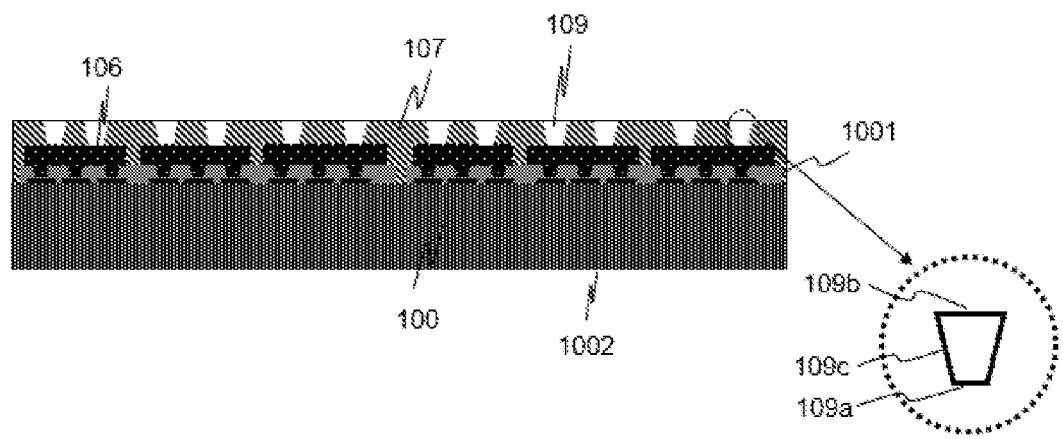
FIG. 4a and FIG. 4b are schematic diagrams of the wafer formed with protective layer openings according to the exemplary embodiment of the present disclosure.
Figure 4B:
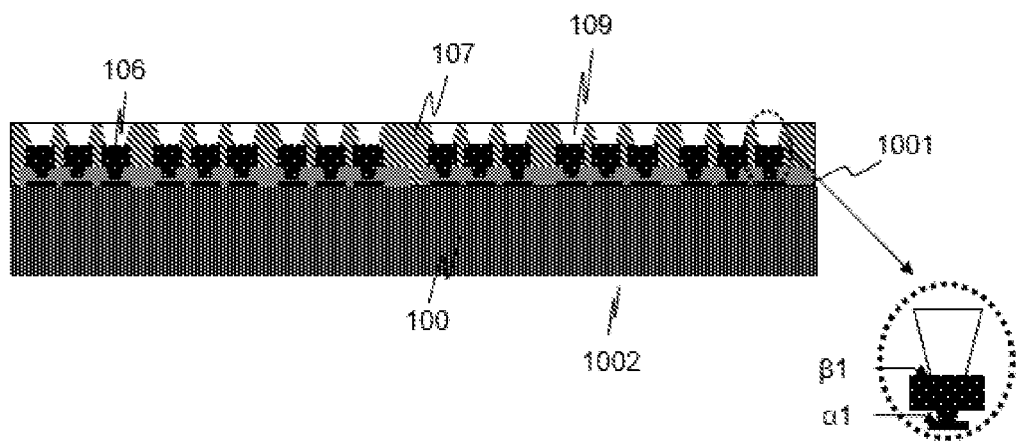

As shown in FIG. 4a and FIG. 4b, the protective layer opening 109 is formed on the surface of the protective layer 107.

At least a part of the protective layer openings 109 are provided at positions corresponding to the wafer conductive traces 106, and the wafer conductive traces 106 are exposed through the protective layer openings 109. The protective layer opening 109 has a lower surface 109a and an upper surface 109b.

In a preferred embodiment, the protective layer opening 109 has a shape such that the area of the upper surface 109b of the protective layer opening is larger than the area of the lower surface 109a of the protective layer opening; in this case, the side wall 109c of the protective layer opening has the slope which facilitates the filling of the conductive material, so that the conductive material is uniformly and continuously formed on the side wall during the filling process.

Optionally, each wafer conductive trace of at least one of the wafer conductive traces 106 corresponds to one or more protective layer openings 109.

Optionally, a contact area α1 of a single contact region between the wafer conductive traces 106 and the electrical connection pads 103 is smaller than a contact area β1 of a single contact region between the wafer conductive traces 106 and the protective layer openings 109.

With respect to the wafer 100 in which an exposed electrical connection pad 103 has a relatively small area, by forming the conductive layer on the wafer active surface 1001 and then forming the protective layer opening, a difficulty in forming the protective layer opening is effectively reduced and a case that the protective layer opening 109 is difficult to form because the lower surface 109a of the protective layer opening is too small is avoided.

Preferably, the protective layer opening is formed by a laser patterning process.

Corresponding to the wafer conductive trace 106 in FIG. 2a, FIG. 4a shows that the protective layer 107 is formed on the wafer conductive traces 106 that each interconnects and leads out a plurality of electrical connection pads; it is shown in the drawing that each wafer conductive trace 106 corresponds to a plurality of protective layer openings 109. It should be understood that, each wafer conductive trace 106 may correspond to one protective layer opening 109; or it may be that each of a part of the wafer conductive traces 106 corresponds to one protective layer opening 109, and each of another part of the wafer conductive traces 106 correspond to a plurality of protective layer openings 109.

Corresponding to the wafer conductive trace 106 in FIG. 2b, FIG. 4b shows that the protective layer 107 is formed on the wafer conductive traces 106 that respectively leads out the electrical connection pads; and preferably, each wafer conductive trace 106 corresponds to one protective layer opening 109.

Figure 5:
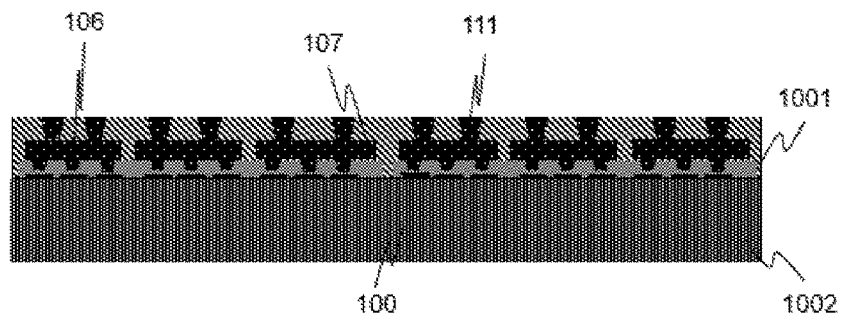

Optionally, as shown in FIG. 5, a conductive medium is filled in the protective layer opening 109 such that the protective layer opening 109 becomes the conductive filled via 111; at least one of the conductive filled vias 111 are connected with the wafer conductive traces 106; and the protective layer surrounds the conductive filled via 111. The conductive medium for example is made of a material such as gold, silver, copper, tin, aluminum and the like, or a combination thereof, or other suitable conductive materials; the conductive medium is filled in the protective layer opening 109 to form the conductive filled via 111 by PVD, CVD, sputtering, electrolytic electroplating, electrodeless electroplating, or other suitable metal deposition processes.

The protective layer opening 109 is completely filled by the conductive medium; or the protective layer opening 109 is partially filled by the conductive medium so that the protective layer opening 109 has only a layer of conductive material formed therein, as long as the layer of conductive material is possible to be electrically connected with a panel-level conductive layer. Accordingly, it should be understood that, it is not necessary to form the conductive filled via 111 by completely filling the protective layer opening, as along as the protective layer opening has the conductive medium and the conductive medium is possible to be electrically connected with the panel-level conductive layer.

Firstly, the wafer conductive trace 106 is electrically connected with the electrical connection pad 103; because the wafer conductive trace 106 is formed at a wafer level, an accuracy of alignment of the wafer conductive trace 106 with the electrical connection pad 103 is high; then by forming the protective layer opening 109 in the protective layer 107 and/or filling the conductive medium in the protective layer opening 109, the wafer conductive trace 106 is accurately positioned by the protective layer opening 109.

Figure 6:
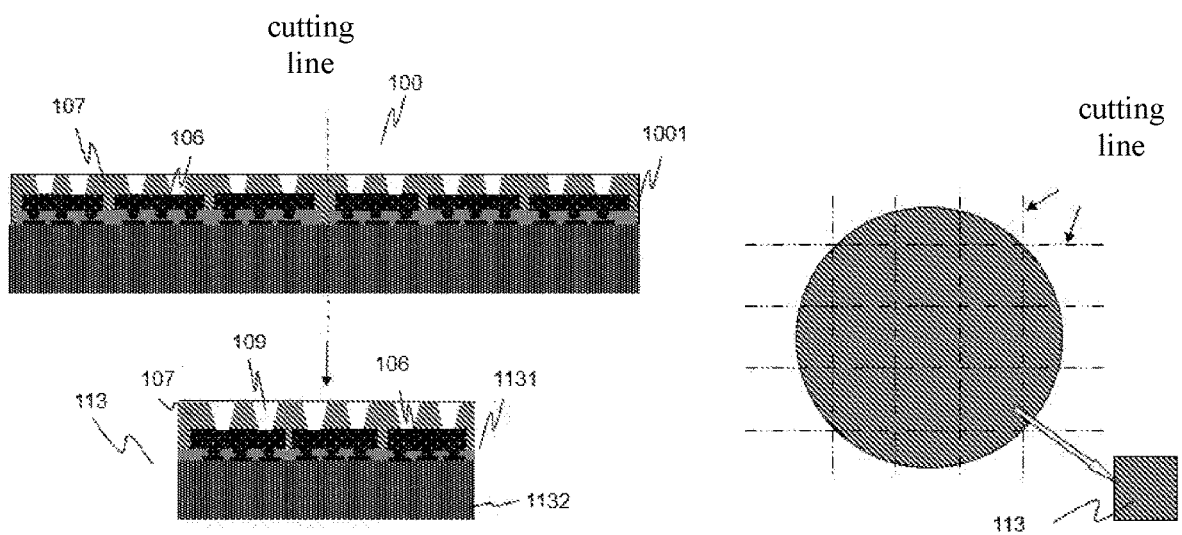

As shown in FIG. 6, the wafer 100 formed with the wafer conductive trace 106 and applied with the protective layer 107 is cut along a cutting line to obtain a plurality of dies 113; and each die 113 has a die active surface 1131 and a die back surface 1132.

In one embodiment, the wafer 100 having the wafer conductive trace 106 and the protective layer 107 as shown in FIG. 3 is cut to form the die 113.

In one embodiment, the wafer 100 having the wafer conductive trace 106, the protective layer 107 and the protective layer opening 109 as shown in FIG. 4a and FIG. 4b is cut to form the die 113.

In one embodiment, the wafer 100 having the wafer conductive trace 106, the protective layer 107 and the conductive filled via 111 as shown in FIG. 5 is cut to form the die 113.

Due to the material properties of the protective layer, the die 113 which is separated out in the process of cutting the wafer 100 has no burrs and chippings.

In one embodiment, before the step of cutting the wafer 100 to separate out the dies 113, the method further comprises: performing plasma surface treatment on the surface, applied with the protective layer 107, of the wafer 100 to increase surface roughness, so that adhesiveness of the die 113 to the carrier 117 in a subsequent process is increased and thus position shift of the die 113 under the package pressure is less likely to occur.

It should be understood that, if the process permits, the wafer conductive trace 106 and/or the protective layer 107 for example are/is formed on the die active surface 1131 of each die 113 after the wafer 100 is cut into the dies 113 to be packaged according to specific practical situations. The wafer conductive trace 106 refers to a conductive layer formed before the die 113 obtained by cutting the wafer 100 is adhered to the carrier.

Figure 7A:
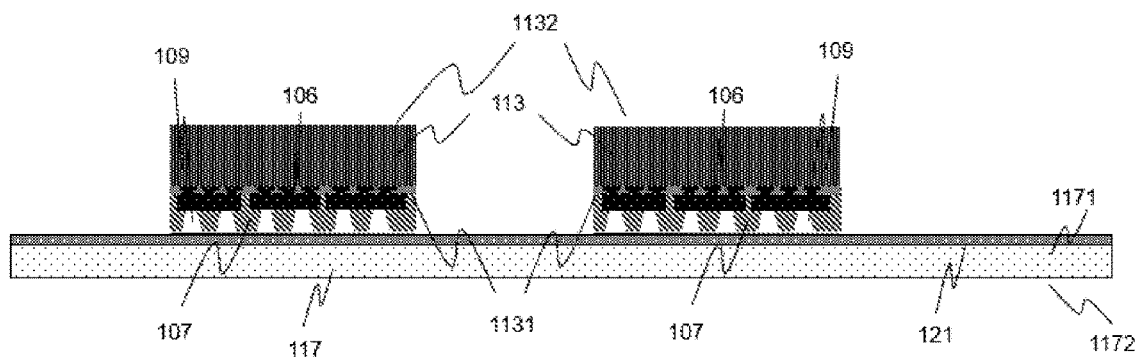
FIG. 7a and FIG. 7b are schematic diagrams of adhering the die onto a carrier according to the exemplary embodiment of the present disclosure.
Figure 7B:
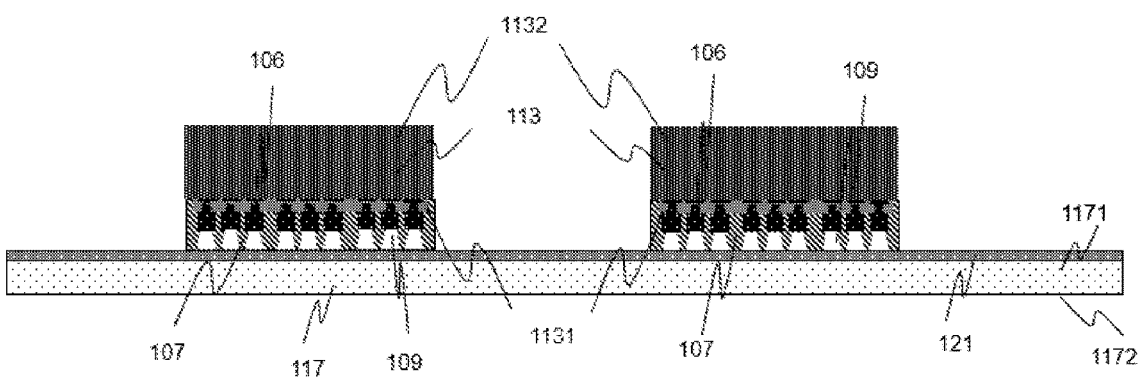
Figure 7C:
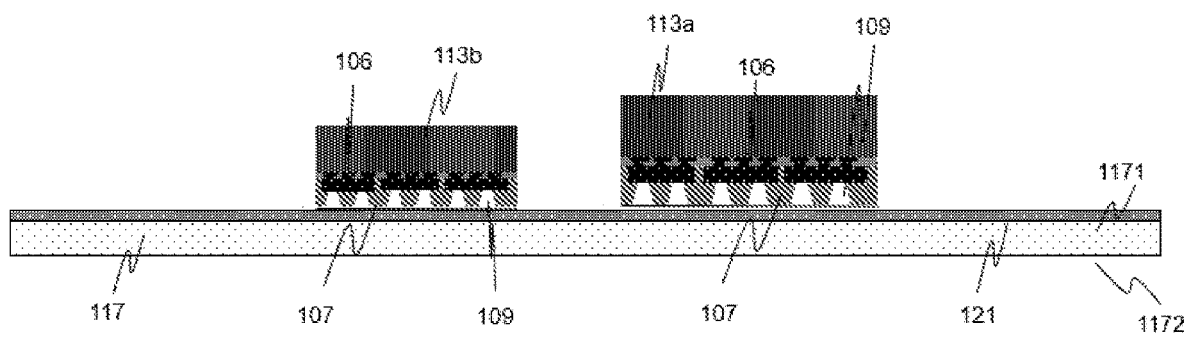
FIG. 7c is a schematic diagram of bonding a combination of dies onto the carrier according to the exemplary embodiment of the present disclosure.

As shown in FIG. 7a, FIG. 7b and FIG. 7c, the carrier 117 is provided; the carrier 117 has a carrier front surface 1171 and a carrier back surface 1172; the die 113 separated out is arranged at a predetermined position on the carrier front surface 1171, the die active surface 1131 faces the carrier 117, and the die back surface 1132 faces away from the carrier 117.

The carrier 117 for example has a shape of a circle, a triangle, a quadrangle or any other shape; the carrier 117 for example has a size of a small-sized wafer substrate, or has various sizes, particularly is a large-sized rectangular carrier; and the carrier 117 for example is made of metal, non-metal, plastic, resin, glass and stainless steel, etc. Preferably, the carrier 117 is a large-sized quadrangular stainless steel panel.

The carrier 117 has the carrier front surface 1171 and the carrier back surface 1172, and the carrier front surface 1171 preferably is a flat surface.

In one embodiment, the die 113 is bonded and fixed onto the carrier 117 by the adhesive layer 121.

The adhesive layer 121 for example is formed on the carrier front surface 1171 by lamination, printing, spraying and coating, etc. In order to facilitate separation of the carrier 117 from the die 113 whose back side has been packaged in a subsequent process, the adhesive layer 121 is preferably made of a material capable of being easily separated, for example, a thermal-releasing material.

Preferably, a position mark for arranging the die 113 is previously formed on the carrier 117, the mark is formed on the carrier 117 by laser, mechanical patterning, etc., and meanwhile, an alignment mark is provided on the die 113 to aim for and align with a position for adhering on the carrier 117 during adhering.

A form of the die 113 arranged on the carrier 117 for example is in a form of the die that the wafer conductive trace 106 on the die 113 interconnects and leads out a plurality of electrical connection pads 103 of at least a part of electrical connection pads 103 provided on the die active surface 1131 as shown in FIG. 7a, or is in a form of the die that the wafer conductive traces 106 respectively lead out at least a part of the electrical connection pads 103 provided on the die active surface 1131 as shown in FIG. 7b, or is in a form of the die 113 formed by cutting the wafer 100 having the wafer conductive trace 106 and the protective layer 107 as shown in FIG. 3, or is in a form of the die formed by cutting the wafer 100 having the wafer conductive trace 106, the protective layer 107 and the conductive filled via 111 as shown in FIG. 5.

Optionally, as shown in FIG. 7c, in a single packaging process, a plurality of dies 113a and 113b, particularly, a plurality of dies 113a and 113b having different functions (which are shown as two in the drawing, or may be more than two dies) are arranged on the carrier 117 according to actual product requirements, then are packaged, and further are cut into a plurality of package bodies after packaging is completed; and thus, one package body includes the plurality of dies 113a and 113b so as to form a multi-chip module (MCM), and positions of the plurality of dies 113a and 113b may be freely set according to actual product requirements.

Figure 8:
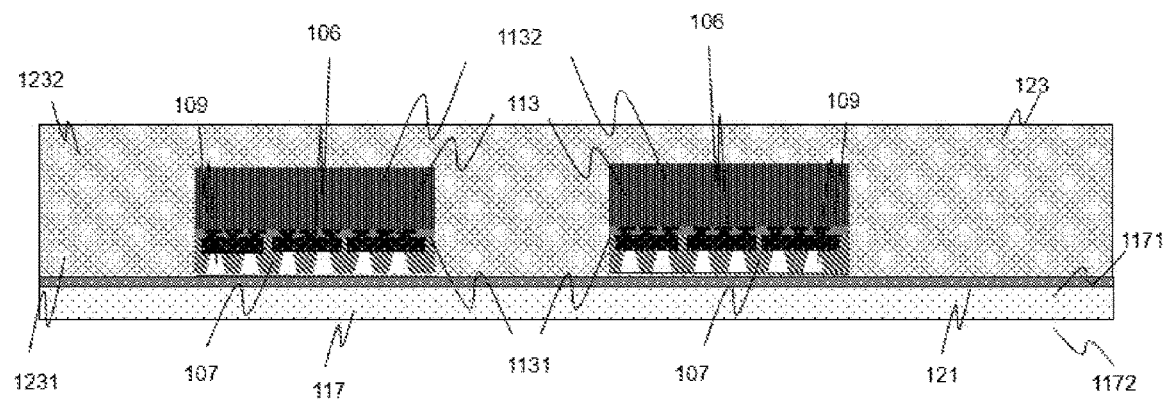

As shown in FIG. 8, a molding layer 123 is formed.

The molding layer 123 is formed on all exposed surface of the die 113 to be packaged and the exposed surface of the carrier front surface 1171 or the adhesive layer 121. The molding layer 123 is used to completely encapsulate the carrier front surface 1171 and the die 113, so as to reconstruct a flat-plate structure; after the carrier 117 is stripped off, a subsequent packaging step is continued on the reconstructed flat-plate structure.

A surface of the molding layer 123 that is in contact with the carrier front surface 1171 or the adhesive layer 121 is defined as a molding layer front surface 1231. A surface of the molding layer 123 that faces away from the carrier front surface 1171 or the adhesive layer 121 is defined as a molding layer back surface 1232.

Preferably, the molding layer front surface 1231 and the molding layer back surface 1232 are substantially flat and parallel to the carrier front surface 1171.

The molding layer 123 for example is formed by paste printing, injection molding, hot press molding, compression molding, transfer molding, liquid sealant molding, vacuum lamination, or other suitable mode of molding. The molding layer 123 for example is made of an organic composite material, a resin composite material, a macromolecule composite material, a polymer composite material, such as an epoxy resin having a filler, an Ajinomoto buildup film (ABF) or other polymer having a suitable filler.

In one embodiment, the molding layer 123 is made of an organic/inorganic composite material by compression molding.

Preferably, the molding layer 123 has a coefficient of thermal expansion in a range of 3 ppm/K to 10 ppm/K; in a preferred embodiment, the molding layer 123 has a coefficient of thermal expansion of 5 ppm/K; in another preferred embodiment; the molding layer 123 has a coefficient of thermal expansion of 7 ppm/K; and in still another preferred embodiment, the molding layer 123 has a coefficient of thermal expansion of 10 ppm/K.

Preferably, the molding layer 123 and the protective layer 107 have a same or similar coefficient of thermal expansion.

The coefficient of thermal expansion of the molding layer 123 is selected to be 3 ppm/K to 10 ppm/K, and is selected to be the same as or similar to the coefficient of thermal expansion of the protective layer 107; during heating and cooling processes of the molding process, the protective layer 107 and the molding layer 123 have a uniform degree of expansion and contraction, so that an interface stress is not easily caused between the protective layer 107 and the molding layer 123; and such low coefficient of thermal expansion of the molding layer allows the molding layer, the protective layer and the die to have coefficients of thermal expansion close to one another, so that the molding layer 123, the protective layer 107 and the die 113 are bonded closely at the interfaces therebetween, to avoid their separations at the interfaces therebetween.

The packaged chip usually needs to undergo the thermal cycle during being used; in the case that the protective layer 107, the molding layer 123 and the die 113 have coefficients of thermal expansion close to one another, the protective layer 107, the molding layer 123 and the die 113 have little interface fatigue in the thermal cycle, and an interface gap is less likely to occur between the protective layer 107, the molding layer 123 and the die 113, so that a service life of the chip is prolonged and an application field of the chip is widened.

A difference in the coefficients of thermal expansion between the die 113 and the molding layer 123 may cause warpage of the panel after the molding process is completed; due to the warpage phenomenon, it is difficult to accurately position the die 113 in the panel in a subsequent process of forming the conductive layer, which thus has a great impact on the process of forming the conductive layer.

Particularly, in a large panel packaging process, because a size of the panel is relatively large, even slight panel warpage may cause the die in an outer peripheral portion of the panel that is away from a center of the panel to generate a greater position change as compared with the position of the die before being molded; so in the large panel packaging process, solving the warpage problem becomes one of key points of the whole process; and the warpage problem even limits magnification development of the size of the panel and becomes a technical barrier in the packaging process of the large-sized panel.

The coefficients of thermal expansion of the protective layer 107 and the molding layer 123 are limited to the range of 3 ppm/K to 10 ppm/K, and preferably, the molding layer 123 and the protective layer 107 have the same or similar coefficient of thermal expansion, so that occurrence of warpage of the panel is effectively avoided and the packaging process of the large panel is implemented.

Meanwhile, during the molding process, because the package pressure exerts a pressure onto the back side of the die 113, the pressure tends to press the die 113 into the adhesive layer 121, so that the die 113 sinks into the adhesive layer 121 in the process of forming the molding layer 123; after the molding layer 123 is formed, the die 113 and the molding layer front surface 1231 are not located in a same plane, and the surface of the die 113 protrudes beyond the molding layer front surface 1231 to form a stepped structure; during a subsequent process of forming the conductive layer, the conductive trace 125 also has a corresponding stepped structure, which makes the package structure unstable.

In the case that the die active surface 1131 has the protective layer 107 with the above material properties, the protective layer 107 acts as a buffer under the package pressure to avoid the die 113 from sinking into the adhesive layer 121, so as to avoid generation of the stepped structure on the molding layer front surface 1231.

Figure 9A:
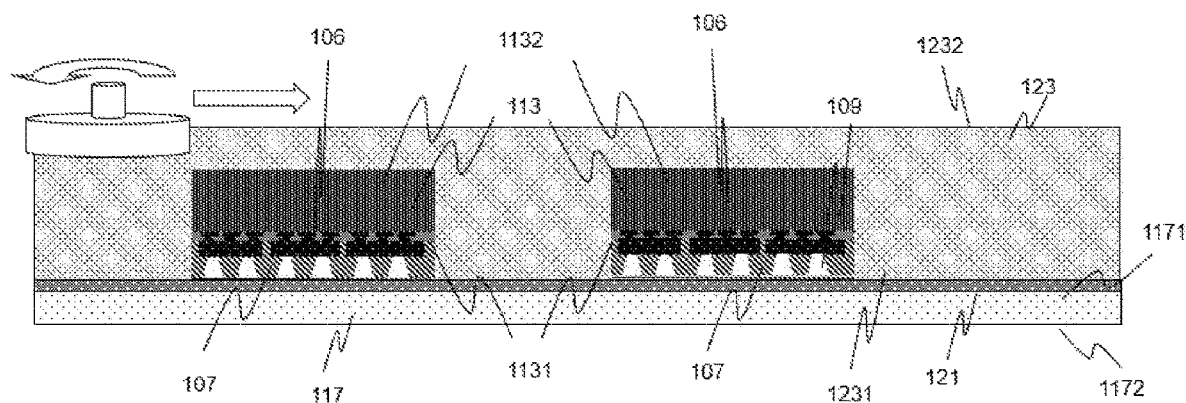
FIG. 9a is a schematic diagram of thinning the molding layer according to the exemplary embodiment of the present disclosure.

As shown in FIG. 9a, a thickness of the molding layer 123 is thinned by grinding or polishing the molding layer back surface 1232.

Figure 9B:
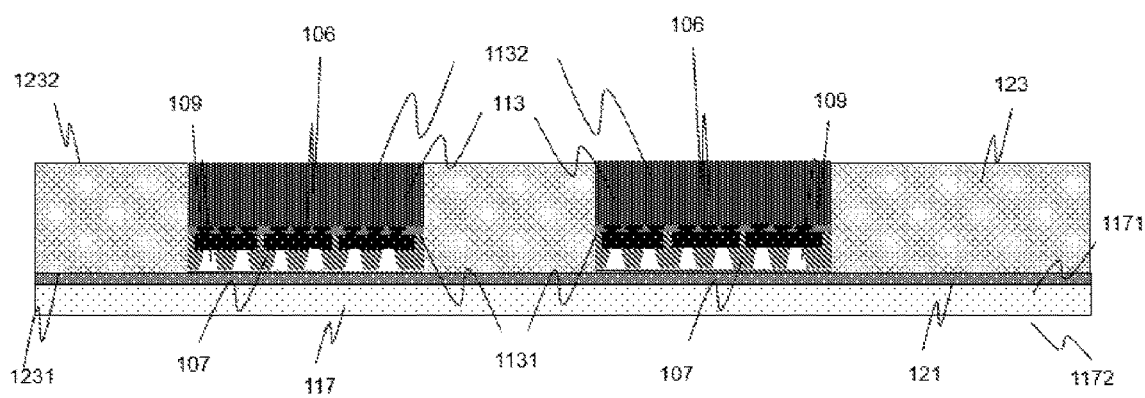
FIG. 9b is a schematic diagram of thinning the molding layer to expose a die back surface according to the exemplary embodiment of the present disclosure.

In one embodiment, as shown in FIG. 9b, the thickness of the molding layer 123 is thinned to the die back surface 1132 of the die 113 to expose the die back surface 1132. The packaged chip structure is as shown in FIG. 15b.

Figure 10:
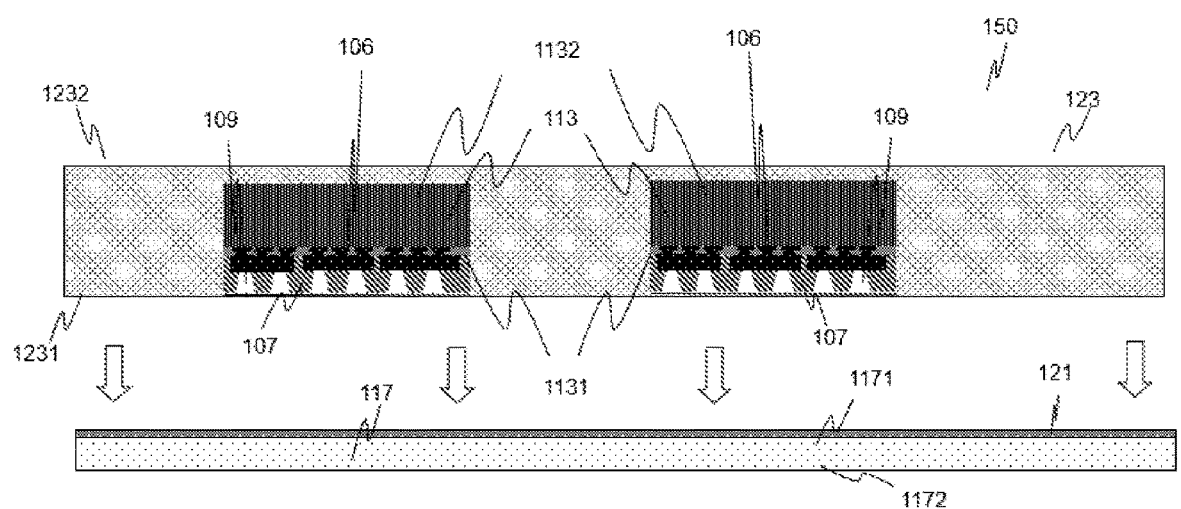

As shown in FIG. 10, the carrier 117 is stripped off to expose the molding layer front surface 1231 and the protective layer 107.

In one embodiment, if the die 113 arranged on the carrier 117 has the protective layer opening 109, the protective layer opening 109 is also exposed after the carrier 117 is stripped off.

In one embodiment, if the die 113 arranged on the carrier 117 has not yet had the protective layer opening formed in the protective layer 107, the method further comprises a step of forming the protective layer opening in the protective layer 107 provided on the die 113 packaged by the molding layer 123 after the carrier 117 is stripped off.

In one embodiment, if the die 113 arranged on the carrier 117 is the die 113 having the conductive filled via 111, the conductive filled via 111 is also exposed after the carrier 117 is stripped off.

After the carrier 117 is removed, a structure in which the molding layer 123 encapsulates the die 113 is defined as the panel assembly 150.

Figure 11:
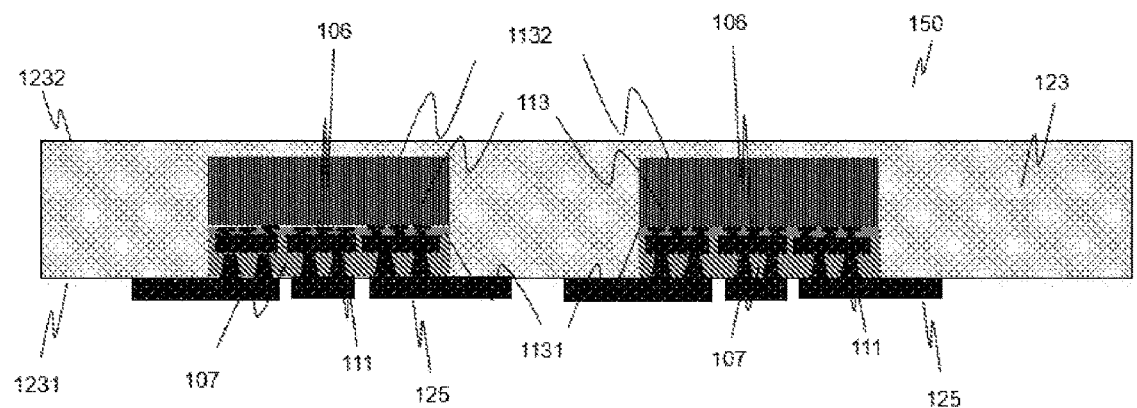
Figure 12:
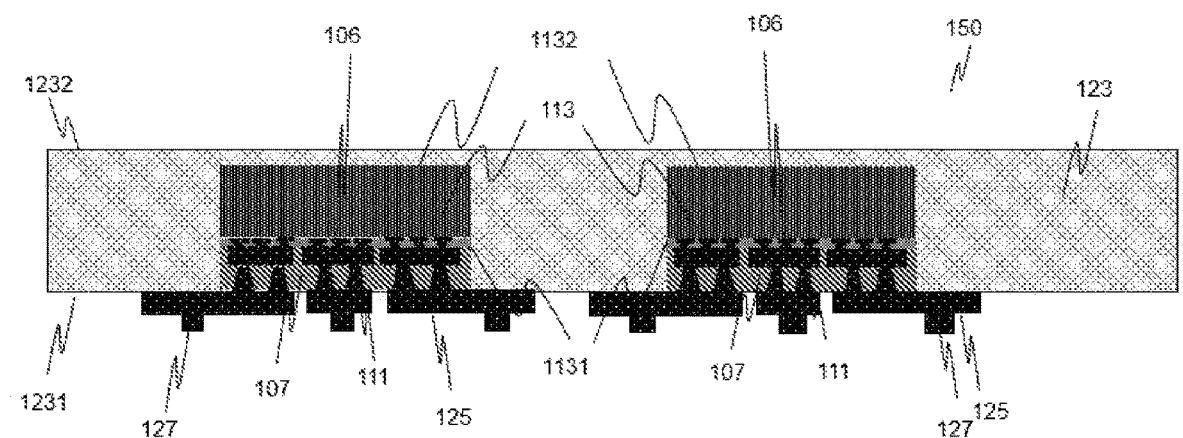

FIG. 11 and FIG. 12 show one embodiment of a process of forming the patterned panel-level conductive layer on the die 113 within the molding layer 123.

If the protective layer 107 on the surface of the die 113 packaged within the molding layer 123 has not had the conductive filled via 111 formed, the conductive medium is filled in the protective layer opening 109 such that the protective layer opening 109 becomes the conductive filled via 111; at least one of the conductive filled vias 111 are electrically connected with the wafer conductive traces 106; and the protective layer surrounds the conductive filled via 111. The conductive medium for example is made of a material such as gold, silver, copper, tin, aluminum and the like, or a combination thereof, or other suitable conductive materials; the conductive medium is filled in the protective layer opening 109 to form the conductive filled via 111 by physical vapor deposition (PVD), chemical vapor deposition (CVD), sputtering, electrolytic electroplating, electrodeless electroplating, or other suitable metal deposition processes.

The protective layer opening 109 is completely filled by the conductive medium; or the protective layer opening 109 is partially filled by the conductive medium so that the protective layer opening 109 has only a layer of conductive material formed therein, as long as the layer of conductive material is possible to be electrically connected with the panel-level conductive layer. Accordingly, it should be understood that, it is not necessary to form the conductive filled via 111 by completely filling the protective layer opening, as along as the protective layer opening has the conductive medium and the conductive medium is possible to be electrically connected with the panel-level conductive layer.

FIG. 11 shows that a conductive trace 125 is formed on the die 113 within the molding layer 123; at least a part of the conductive traces 125 are formed on the surface of the protective layer 107 provided on the die active surface 1131, and are electrically connected with at least one of the conductive filled vias 111; in one embodiment, the conductive trace 125 extends along the surface of the protective layer 107 and the molding layer front surface 1231, and extends to an edge of the chip package body; and the packaged chip structure is as shown in FIG. 15b. The conductive trace 125 extends to the edge of the chip package body, and in this case, the conductive trace 125 covers and connects interfaces between the protective layer 107 and the molding layer 132, so that stability of the packaged chip structure is increased.

The conductive trace 125 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Preferably, the formation of the conductive trace 125 and the filling of the conductive material to form the conductive filled via 111 are performed in a same step for forming metal layer.

Of course, for example, the formation of the conductive trace 125 and the filling of the conductive material to form the conductive filled via 111 are performed in different steps.

FIG. 12 shows that a conductive stud 127 is formed on a pad or a connection point of the conductive trace 125; the conductive stud 127 for example has a shape of a circle, or may have other shape such as an ellipse, a square, a line and the like. The conductive stud 127 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

The panel-level conductive layer comprises the conductive trace 125 and/or the conductive stud 127, and the panel-level conductive layer has one layer or a plurality of layers. The panel-level conductive layer for example has a fan-out RDL function.

Figure 13A:
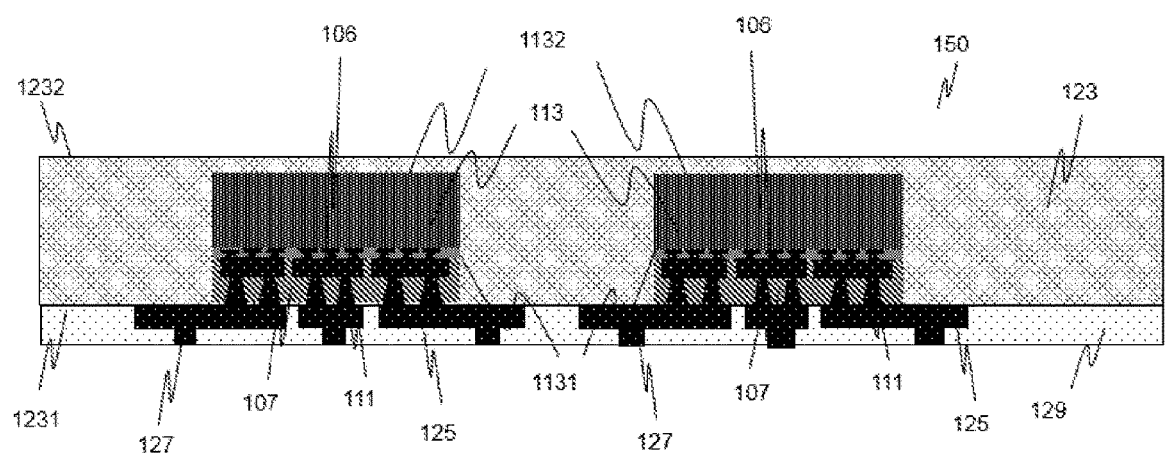
FIG. 13a, FIG. 13b and FIG. 13c are schematic diagrams of forming a dielectric layer on the panel assembly according to the exemplary embodiment of the present disclosure.
Figure 13B:
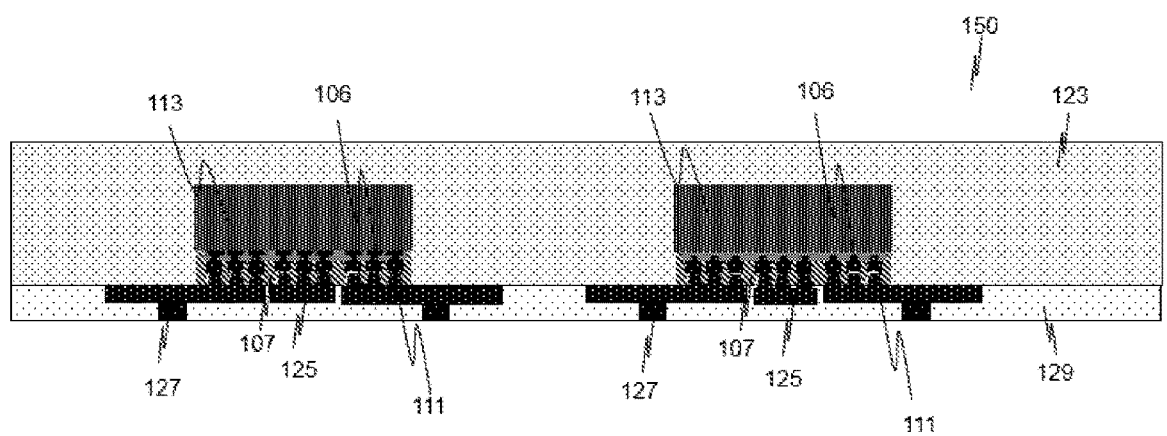
Figure 13C:
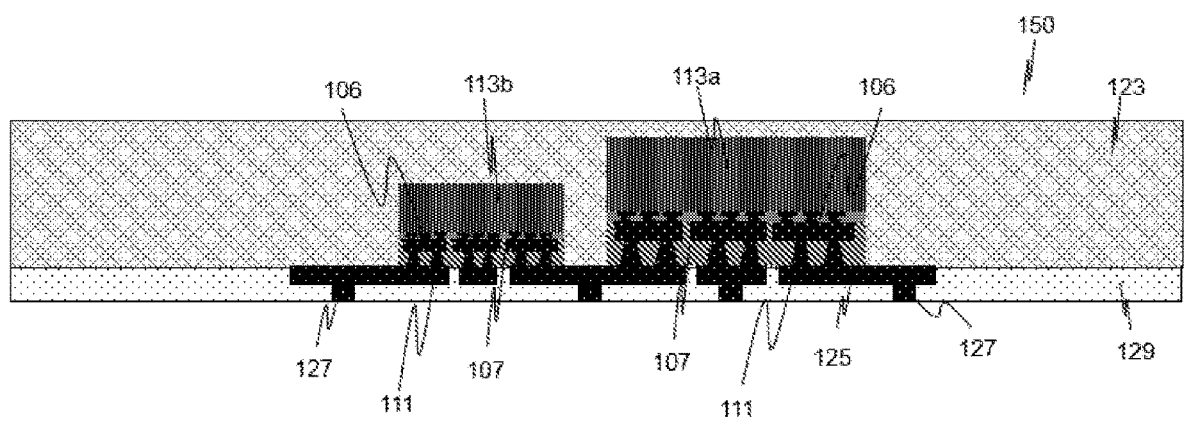

As shown in FIG. 13a, FIG. 13b and FIG. 13c, a dielectric layer 129 is formed on the panel-level conductive layer.

One or more dielectric layers 129 are formed on the surface of the panel-level conductive layer by lamination, coating, spraying, printing, molding, or other suitable method.

The dielectric layer 129 for example is made of benzocyclobutene (BCB), polyimide (PI), polybenzoxazole (PBO), Ajinomoto Build up Film (ABF), silicon dioxide, silicon nitride, silicon oxynitride, tantalum pentoxide, aluminum oxide, polymer-based dielectric film, organic polymer film; or is made of an organic composite material, a resin composite material, a macromolecule composite material, a polymer composite material, such as an epoxy resin having a filler, ABF, or other polymer having a suitable filler; or is made of other material having similar insulation and structural properties. In a preferred embodiment, the dielectric layer 129 is made of ABF. The dielectric layer 129 is insulating and plays a role of protecting the conductive layer.

In one embodiment, the dielectric layer 129 is applied to have a thickness that is greater than a thickness of the panel-level conductive layer, and the panel-level conductive layer is exposed by a polishing process; in another embodiment, the dielectric layer 129 is applied to have a thickness that is equal to the thickness of the panel-level conductive layer, so that the panel-level conductive layer is just exposed after the dielectric layer 129 is applied.

In one embodiment, the steps of FIG. 11 to FIG. 13c are repeated to form a plurality of panel-level conductive layers on the die active surface 1131 of the die 113.

Return to steps of FIG. 11 to FIG. 13c. In one embodiment, the step of forming the panel-level conductive layer for example is as follows:

Forming the conductive trace 125 on the die active surface 1131 of the die 113;

Forming one or more dielectric layers 129 on the surface of the conductive trace 125 by lamination, coating, spraying, printing, molding, or other suitable method; a height of the dielectric layer 129 being higher than a height of the conductive trace 125, and the conductive trace 125 being completely encapsulated in the dielectric layer 129;

Forming an opening in the dielectric layer 129 at a position corresponding to the pad or the connection point of the conductive trace 125, and forming the conductive stud 127 in the opening.

In still another embodiment, the conductive stud 127 is not formed in the opening, so that the pad or the connection point of the conductive trace 125 of the completed package body is exposed from the opening.

In a preferred embodiment, after the step of applying the dielectric layer 129, an outermost panel-level conductive layer is etched and thinned, to form a groove 131 on an outer surface of the dielectric layer 129; and the packaged chip structure is as shown in FIG. 15b.

Optionally, as shown in FIG. 13c, in a single packaging process, two dies 113a and 113b, particularly, 113a and 113b has different functions (which are shown as two in the drawing, or may be more than two dies) are packaged into the multi-chip module, and patterns of the conductive layers of the dies 113a and 113b are designed according to electrical connection needs of actual products. The packaged chip structure is as shown in FIG. 15d.

Figure 14:
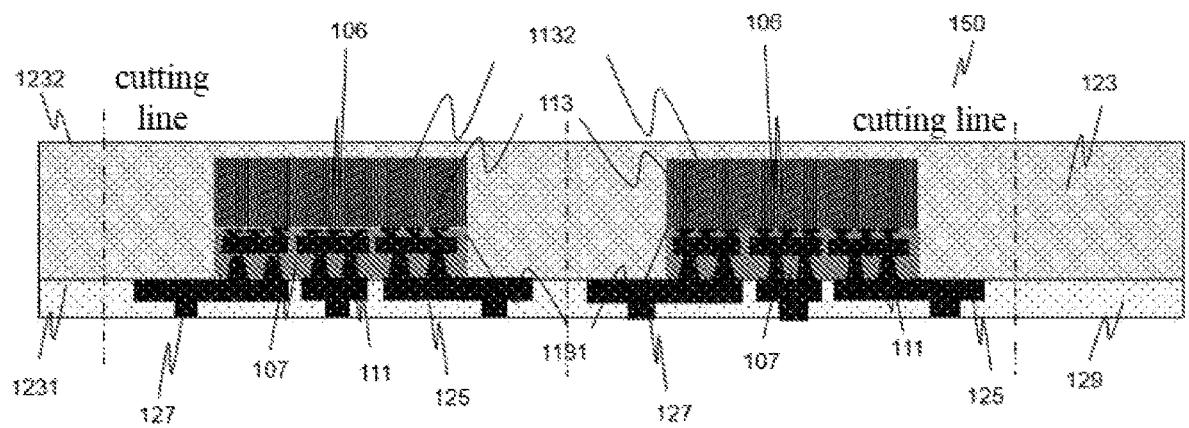

As shown in FIG. 14, the package single body is separated out by cutting to form the packaged chip, and the cutting for example is performed by employing machinery or laser.

Chip package structures may also be provided in the embodiment of the present disclosure. For example, the chip package structures formed using the packaging method described in the above embodiments. Therefore, all the description in the embodiments of the above packaging method are applicable to the chip package structures.

FIG. 15a, FIG. 15b, FIG. 15c and FIG. 15d are schematic diagrams of chip package structures obtained by using the packaging method provided by the exemplary embodiment of the present disclosure. The chip package structure comprises: at least one die 113, the die 113 including the die active surface 1131 and the die back surface 1132; a conductive structure, provided on a side having the die active surface 1131; the protective layer 107, provided on the side having the die active surface 1131; the molding layer 123, the molding layer 123 encapsulating the die 113; and the dielectric layer 129.

In some embodiments, the conductive structure includes the wafer conductive trace 106, the conductive filled via 111 and the panel-level conductive layer 170; and the conductive filled via 111 is formed in the protective layer 107.

In some embodiments, the die active surface 1131 includes the electrical connection pad 103 and the insulating layer 105; a part or all of the wafer conductive traces 106 are electrically connected with a part or all of the electrical connection pads 103, to lead out the part or all of the electrical connection pads from the die active surface 1131; a lower surface 111a of the conductive filled via is electrically connected with the wafer conductive trace 106; and an upper surface 111b of the conductive filled via is electrically connected with the panel-level conductive layer 170.

In some embodiments, the panel-level conductive layer 170 includes the conductive trace 125 and/or the conductive stud 127; the conductive stud 127 is formed on the pad or the connection point of the conductive trace 125; the dielectric layer 129 encapsulates the panel-level conductive layer 170; and the panel-level conductive layer 170 comprises one layer.

Although not shown in the drawings, the panel-level conductive layer for example comprises a plurality of layers.

In some embodiments, the protective layer 107 has the Young's modulus of any numerical range or value below: 1,000 MPa to 20,000 MPa, 1,000 MPa to 10,000 MPa, 4,000 MPa to 8,000 MPa, 1,000 MPa to 7,000 MPa, 4,000 MPa to 7,000 MPa and 5,500 MPa.

In some embodiments, the protective layer 107 is made of the organic/inorganic composite material.

In some embodiments, the protective layer 107 has the thickness of any numerical range or value below: 15 μm to 50 μm, 20 μm to 50 μm, 35 μm, 45 μm and 50 μm.

In some embodiments, the protective layer 107 has the coefficient of thermal expansion of any numerical range or value below: 3 ppm/K to 10 ppm/K, 5 ppm/K, 7 ppm/K and 10 ppm/K.

In some embodiments, the molding layer 123 has the coefficient of thermal expansion of any numerical range or value below: 3 ppm/K to 10 ppm/K, 5 ppm/K, 7 ppm/K and 10 ppm/K.

In some embodiments, the protective layer 107 and the molding layer 123 have a same or similar coefficient of thermal expansion.

In some embodiments, the protective layer 107 includes the inorganic filler particles, and the inorganic filler particles have a diameter of less than 3 µm.

In some embodiments, the inorganic filler particles have a diameter between 1 µm and 2 µm.

Figure 15A:
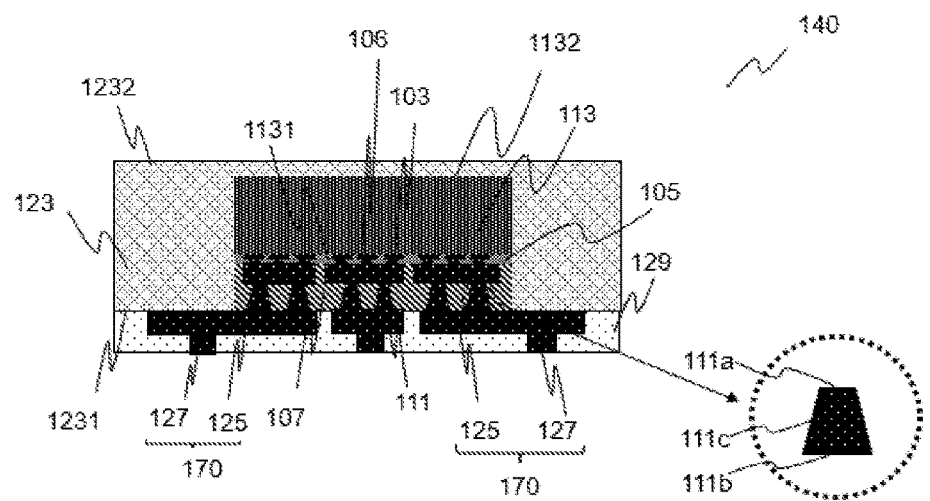
FIG. 15a, FIG. 15b, FIG. 15c and FIG. 15d are schematic diagrams of chip package structures obtained by using the above-described packaging method according to the exemplary embodiment of the present disclosure.
Figure 15B:
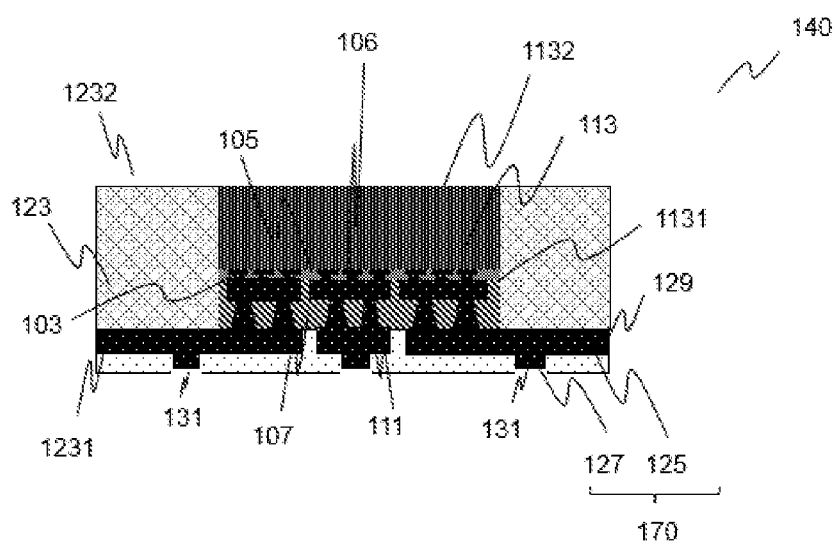

In some embodiments, as shown by an enlarged view in FIG. 15a, the conductive filled via 111 has the lower surface 111a and the upper surface 111b, and an area of the lower surface 111a of the conductive filled via is smaller than an area of the upper surface 111b of the conductive filled via.

In some embodiments, as shown in FIG. 15a and FIG. 15b, each of at least one of the wafer conductive traces 106 interconnects and leads out a plurality of electrical connection pads 103 of at least a part of the electrical connection pads 103 provided on the die active surface 1131.

Figure 15C:
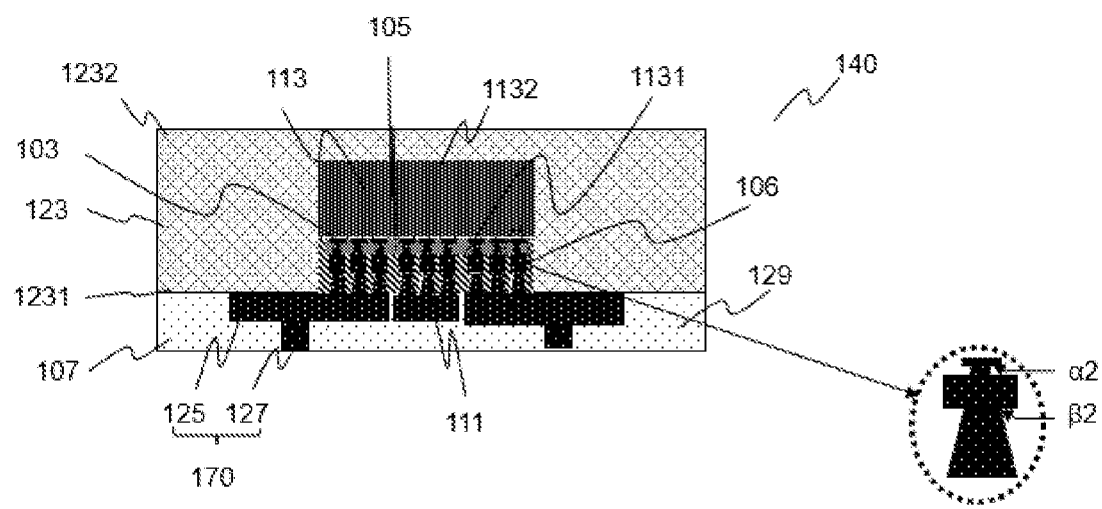
Figure 15D:
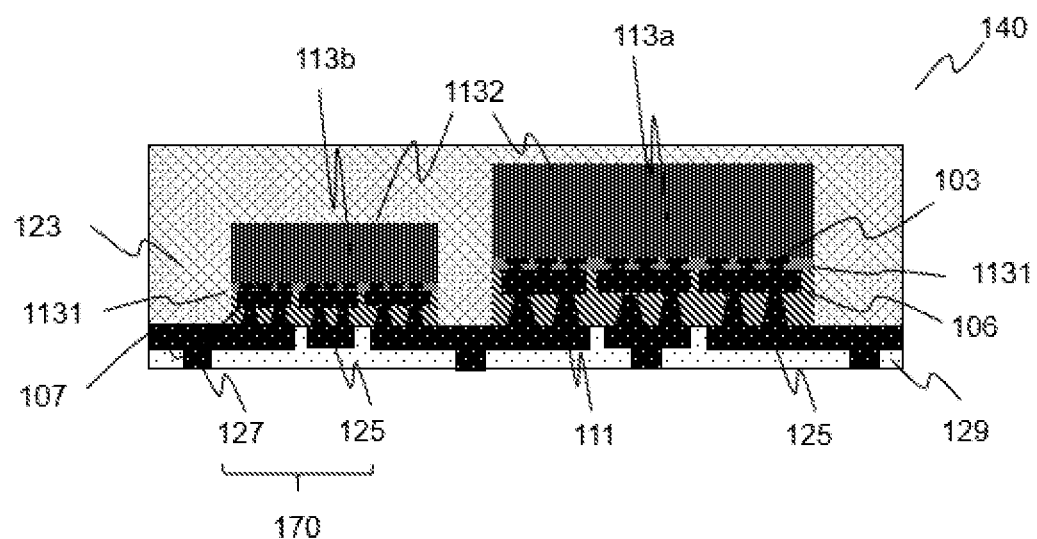

In some embodiments, as shown in FIG. 15c, at least one of the wafer conductive traces 106 respectively lead out at least a part of the electrical connection pads 103 provided on the die active surface 1131.

In some embodiments, as shown by a partially enlarged view in FIG. 15c, a contact area α2 of a single contact region between the wafer conductive traces 106 and the electrical connection pads 103 is smaller than a contact area β2 of a single contact region between the wafer conductive traces 106 and the conductive filled vias 111.

In some embodiments, as shown in FIG. 15b, at least a part of the conductive traces 125 that are closest to the die active surface 1131 are formed on the molding layer front surface 1231 and extend to the edge of the package body.

In some embodiments, as shown in FIG. 15b, the die back surface 1132 is exposed from the molding layer 123.

In some embodiments, as shown in FIG. 15b, the surface of the dielectric layer 129 is provided with the groove at a position corresponding to the conductive layer.

In some embodiments, as shown in FIG. 15d, the package structure includes two or more dies 113.

In some embodiments, as shown in FIG. 15d, the package structure includes two or more dies 113, and the dies 113 are electrically connected according to product design.

Preferably, the dies 113 are dies having different functions, to form the multi-chip module.

It should be noted that, for the materials, structures or technical effects, etc. which are not mentioned in the descriptions of the package structures, reference may be made to the embodiments of the above packaging methods, and the details are not described herein again.

Figure 16:
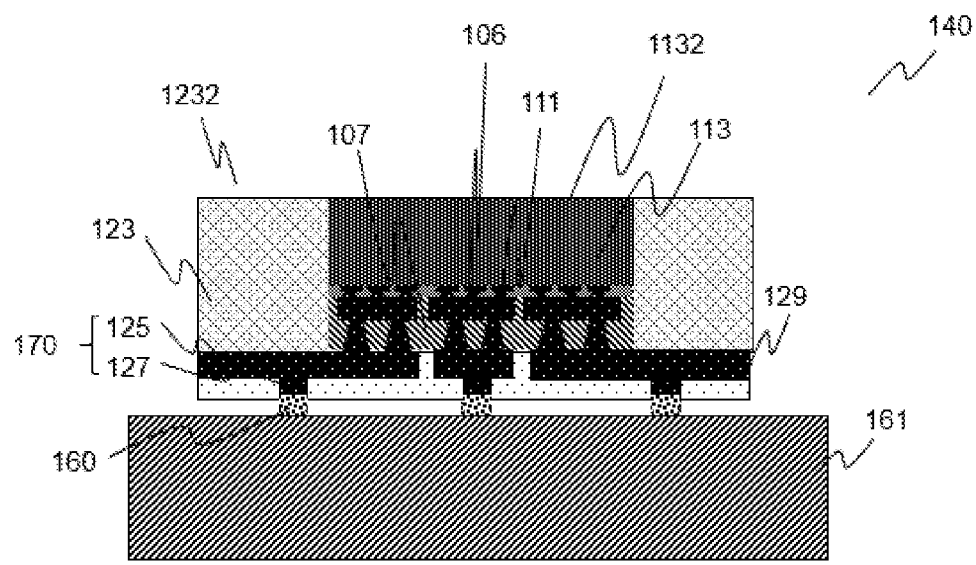
FIG. 16 is a schematic diagram of the packaged chip in use according to the exemplary embodiment of the present disclosure.

FIG. 16 shows a schematic diagram of the packaged chip in use; during the packaged chip is used, the packaged chip is connected to a circuit board or a substrate 161 through a solder 160, and then is connected with other circuit elements.

In the case that the surface of the dielectric layer 129 of the packaged chip has the groove 131, the solder 160 is stably provided and is difficult to shift.

The following examples pertain to various embodiments.

According to some embodiments, the present disclosure is intended to provide a chip packaging method and a chip package structure, and the chip packaging method reduces or eliminates warpage in a panel packaging process, lowers a requirement on an accuracy of aligning a die on a panel, reduces a difficulty in the panel packaging process, and makes a packaged chip structure more durable, and thus the present disclosure is especially suitable for large panel-level package and package of a thin chip with a large electric flux.

At least one embodiment in the present disclosure relates to a package structure, comprising: at least one die, the at least one die including a die active surface and a die back surface; a conductive structure, provided on the die active surface; a protective layer, provided on the die active surface; a molding layer encapsulating the at least one die; and a dielectric layer.

According to some embodiments, the conductive structure includes wafer conductive traces, conductive filled vias and a panel-level conductive layer, and the conductive filled vias are provided in the protective layer.

According to some embodiments, the die active surface includes electrical connection pads and an insulating layer; at least one of the wafer conductive traces are electrically connected with the electrical connection pads to lead out the electrical connection pads from the die active surface; lower surfaces of the at least one of the conductive filled vias are electrically connected with the wafer conductive traces; upper surfaces of the at least one of the conductive filled vias are electrically connected with the panel-level conductive layer.

According to some embodiments, the at least one of the wafer conductive traces interconnects and leads out a plurality of electrical connection pads.

According to some embodiments, the at least one of the wafer conductive traces respectively leads out the electrical connection pads.

According to some embodiments, a single contact region between the wafer conductive traces and the electrical connection pads has a smaller contact area than a single contact region between the wafer conductive traces and the conductive filled vias.

According to some embodiments, the panel-level conductive layer includes conductive traces and/or conductive studs; the dielectric layer encapsulates the panel-level conductive layer; and the panel-level conductive layer has one or more layers.

According to some embodiments, the at least one of the conductive traces that are closest to the die active surface are provided on a molding layer front surface of the molding layer and extends to an edge of the chip package structure.

According to some embodiments, the die back surface is exposed from the molding layer.

According to some embodiments, a surface of the dielectric layer is provided with a groove at a position corresponding to the panel-level conductive layer.

According to some embodiments, the at least one die comprises one or more same or different dies, and the same or different dies are electrically connected according to product design.

According to some embodiments, the protective layer comprises an organic/inorganic composite material.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, the protective layer has a thickness of any numerical range or value below: 15 µm to 50 µm, 20 µm to 50 µm, 35 µm, 45 µm and 50 µm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

According to some embodiments, the protective layer and the molding layer have a substantially same coefficient of thermal expansion.

According to some embodiments, the protective layer includes inorganic filler particles and the inorganic filler particles have a diameter of less than 3 μm.

According to some embodiments, the inorganic filler particles have a diameter between 1 μm and 2 μm.

According to some embodiments, each of the conductive filled vias has a lower surface and an upper surface, and the lower surface of each conductive filled via has a smaller area than the upper surface of each conductive filled via.

At least one embodiment in the present disclosure relates to a chip packaging method, comprises the steps: providing a wafer, the wafer having a wafer active surface and a wafer back surface; forming wafer conductive traces on the wafer active surface of the wafer; forming a protective layer on the wafer conductive traces; separating (such as cutting) the wafer into a plurality of dies and adhering the plurality of dies onto a carrier; forming a molding layer for encapsulating the plurality of dies; removing (such as stripping off) the carrier; and forming a panel-level conductive layer and a dielectric layer.

According to some embodiments, the at least one of the wafer conductive traces respectively leads out electrical connection pads provided on the die; and/or each of the at least one of the wafer conductive traces interconnects and leads out a plurality of electrical connection pads provided on the die.

According to some embodiments, the chip packaging method further comprises: forming protective layer openings in the protective layer, wherein a lower surface of each protective layer opening has a smaller area than an upper surface of each protective layer opening; and the at least one of the protective layer openings are provided at positions corresponding to the wafer conductive traces.

According to some embodiments, the chip packaging method further comprises: filling the protective layer openings with a conductive material to form conductive filled vias, wherein the at least one of the conductive filled vias has one end electrically connected with the wafer conductive traces, and the other end electrically connected with the panel-level conductive layer; and a single contact region between the wafer conductive traces and the electrical connection pads has a smaller contact area than a single contact region between the wafer conductive traces and the conductive filled vias.

According to some embodiments, the chip packaging method further comprises: thinning the molding layer at a molding layer back surface of the molding layer to expose a die back surface of the die.

According to some embodiments, the chip packaging method further comprises: forming a groove in the dielectric layer and at a position corresponding to the panel-level conductive layer by etching metal.

According to some embodiments, the chip packaging method further comprises: performing plasma surface treatment and/or chemically-promoting modifier treatment on the wafer active surface of the wafer and/or a surface, facing the wafer, of the protective layer.

According to some embodiments, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, the protective layer has a thickness of any numerical range or value below: 15 μm to 50 μm, 20 μm to 50 μm, 35 μm, 45 μm and 50 μm.

According to some embodiments, the protective layer has a coefficient of thermal expansion of any numerical range or value below: 3 ppm/K to 10 ppm/K, 5 ppm/K, 7 ppm/K and 10 ppm/K.

According to some embodiments, the molding layer has a coefficient of thermal expansion of any numerical range or value below: 3 ppm/K to 10 ppm/K, 5 ppm/K, 7 ppm/K and 10 ppm/K.

According to some embodiments, the protective layer comprises an organic/inorganic composite material.

According to some embodiments, the protective layer and the molding layer have a substantially same coefficient of thermal expansion.

According to some embodiments, the protective layer includes inorganic filler particles; and the inorganic filler particles have a diameter of less than 3 μm.

According to some embodiments, the inorganic filler particles have a diameter between 1 μm and 2 μm.

The specific embodiments as described above are intended to further explain the technical solutions and technical effects of the present disclosure in detail; but it should be understood by those skilled in the art that the foregoing embodiments merely are specific embodiments, and not intended to limit the present disclosure; any modification, equivalent substitution, improvement and the like, made within the inventive ideas of the present disclosure should be covered within the protection scope of the present disclosure.

What is claimed is:

1. A chip package structure, comprising:
at least one die having a die active surface and a die back surface opposed to each other and die side surfaces, wherein the die active surface includes electrical connection pads and an insulating layer;
a protective layer, wherein the protective layer includes first and second protective layer surfaces opposed to each other and side protective layer surfaces, wherein the second protective layer surface is disposed on the die active surface, and
the die side surfaces and the side protective layer surfaces are substantially aligned;
a molding layer encapsulating the at least one die, wherein the molding layer comprises a molding layer front surface and a molding layer back surface opposed to each other, the molding layer front surface is coplanar with the first protective layer surface; and
a conductive structure formed on the die active surface, wherein the conductive structure comprises wafer conductive traces, conductive filled vias and a panel-level conductive layer, and the conductive filled vias are provided in the protective layer, wherein
at least one of the wafer conductive traces is electrically connected with the electrical connection pads to respectively lead out the electrical connection pads from the die active surface,
lower surfaces of at least one of the conductive filled vias are electrically connected with the wafer conductive traces, and
upper surfaces of the at least one of the conductive filled vias are electrically connected with the panel-level conductive layer, and a single contact region between the wafer conductive traces and the electrical connection pads has a smaller contact area than a single contact region between the wafer conductive traces and the conductive filled vias.

2. The chip package structure according to claim 1, wherein the at least one of the wafer conductive traces interconnects and leads out a plurality of electrical connection pads.

3. The chip package structure according to claim 1, wherein the panel-level conductive layer includes conductive traces and/or conductive studs;
a dielectric layer encapsulates the panel-level conductive layer; and
the panel-level conductive layer has one or more layers.

4. The chip package structure according to claim 3, wherein a surface of the dielectric layer is provided with a groove at a position corresponding to the panel-level conductive layer.

5. The chip package structure according to claim 4, wherein the groove is formed on the surface of the dielectric layer at the position corresponding to the panel-level conductive layer by etching metal.

6. The chip package structure according to claim 1, wherein the protective layer comprises an organic/inorganic composite material.

7. The chip package structure according to claim 6, wherein
the protective layer includes inorganic filler particles; and
the inorganic filler particles have a diameter of less than 3 μm.

8. The chip package structure according to claim 1, wherein the protective layer has a Young's modulus ranging from 1,000 MPa to 20,000 MPa.

9. The chip package structure according to claim 1, wherein the protective layer has a thickness ranging from 15 μm to 50 μm.

10. The chip package structure according to claim 1, wherein the protective layer has a coefficient of thermal expansion ranging from 3 ppm/K to 10 ppm/K; and/or the molding layer has as a coefficient of thermal expansion ranging from 3 ppm/K to 10 ppm/K.

11. The chip package structure according to claim 1, wherein the protective layer and the molding layer have a substantially same coefficient of thermal expansion.

12. The chip package structure according to claim 1, wherein each of the conductive filled vias has a lower surface and an upper surface, and the lower surface of each conductive filled via has a smaller area than the upper surface of each conductive filled via.

13. The chip package structure according to claim 1, wherein the die back surface is exposed from the molding layer.

14. The chip package structure according to claim 1, wherein the at least one die comprises two or more dies, and the two or more dies are electrically connected together.

15. The chip package structure according to claim 14, wherein the two or more dies have different functions to form a multi-chip module.

16. The chip package structure according to claim 1, wherein the conductive filled vias are formed by filling protective layer openings with a conductive medium, and the protective layer openings are provided in the protective layer and formed by a laser patterning process.

17. A chip package structure, comprising:
at least one die having a die active surface and a die back surface opposed to each other and die side surfaces, the die active surface includes electrical connection pads and an insulating layer;
a protective layer, wherein the protective layer includes first and second protective layer surfaces opposed to each other and side protective layer surfaces, wherein the second protective layer surface is disposed on the die active surface,
the die side surfaces and the side protective layer surfaces are substantially aligned,
the protective layer comprises an organic/inorganic composite material,
the protective layer includes inorganic filler particles having a diameter of less than 3 μm;
a molding layer encapsulating the at least one die, wherein the molding layer comprises a molding layer front surface and a molding layer back surface opposed to each other, the molding layer front surface is coplanar with the first protective layer surface; and
a conductive structure is disposed on the die active surface, wherein the conductive structure comprises wafer conductive traces, conductive filled vias and a panel-level conductive layer, wherein the conductive filled vias are provided in the protective layer.

18. The chip package structure according to claim 17, wherein the diameter of the inorganic filler particles is between 1 μm and 2 μm.

19. The chip package structure according to claim 17, wherein the inorganic filler particles comprise inorganic oxide particles.

20. The chip package structure according to claim 17, wherein the inorganic filler particles have a fill amount of 50% or more.

* * * * *